US008511632B2

(12) United States Patent
Derakhshan et al.

(10) Patent No.: US 8,511,632 B2
(45) Date of Patent: Aug. 20, 2013

(54) SUSPENSION SYSTEM AND METHOD FOR SUSPENDING AN INNER VESSEL INSIDE AN OUTER VESSEL OF A CRYOSTAT

(75) Inventors: Mark Derakhshan, Florence, SC (US); William Einziger, Florence, SC (US); Longzhi Jiang, Florence, SC (US); Timothy Wise, Florence, SC (US); Venkata Krishnan Veeraraghavan Narayanan, Florence, SC (US); Charles Helms, Florence, SC (US); Charles Dudley Yarborough, Florence, SC (US)

(73) Assignee: General Electric Company, Schenectady, NY (US)

( * ) Notice: Subject to any disclaimer, the term of this patent is extended or adjusted under 35 U.S.C. 154(b) by 254 days.

(21) Appl. No.: 12/985,679

(22) Filed: Jan. 6, 2011

(65) Prior Publication Data

US 2012/0175490 A1  Jul. 12, 2012

(51) Int. Cl.
A47H 1/10 (2006.01)
(52) U.S. Cl.
USPC ............................. 248/317; 62/51.1; 292/162
(58) Field of Classification Search
USPC ...... 248/317; 62/51.1; 138/148; 220/560.1; 292/323, 325; 174/15.4
See application file for complete search history.

(56) References Cited

U.S. PATENT DOCUMENTS 3,021,027 A * 2/1962 Claxton .................... 220/560.1
3,115,983 A * 12/1963 Wissmiller ................ 220/560.1
4,300,354 A * 11/1981 Buchs et al. .................. 62/45.1
4,481,778 A * 11/1984 Reinker et al. ............... 62/45.1
4,516,405 A * 5/1985 Laskaris ....................... 62/50.7
4,848,103 A * 7/1989 Pelc et al. ..................... 62/51.1
4,902,995 A * 2/1990 Vermilyea .................... 505/211
5,995,221 A    11/1999 Slutter et al.
6,822,446 B2  11/2004 Havens et al.
7,170,377 B2   1/2007 Jiang et al.
7,412,835 B2   8/2008 Legall et al.
2008/0022698 A1 * 1/2008 Hobbs et al. ................. 62/51.1
2010/0244824 A1  9/2010 Jiang et al.

FOREIGN PATENT DOCUMENTS

EP    0284875 A2    10/1988

OTHER PUBLICATIONS

Search Report from corresponding GB Application No. 1122019.1, Apr. 19, 2012.

* cited by examiner

*Primary Examiner* — Amy J. Sterling
(74) *Attorney, Agent, or Firm* — The Small Patent Law Group; Dean D. Small

(57) ABSTRACT

A suspension system for a cryostat includes a coupling mechanism, a fixation body, and a pin. The coupling mechanism is joined to an outer vessel and coupled with a strap. The fixation body is joined to an inner vessel. The fixation body extends between a front side that faces the coupling mechanism and an opposite receiving side with an interior channel extending from the receiving side to the front side. The channel defines a front opening in the front side and a rear opening in the receiving side. The pin is loaded into the fixation body through the rear opening in the receiving side of the fixation body with the strap looped around the pin and extending through the front opening to the coupling mechanism. The pin secures the coupling mechanism to the fixation body via the strap by engaging the fixation body inside the channel.

18 Claims, 11 Drawing Sheets

SUSPENSION SYSTEM AND METHOD FOR SUSPENDING AN INNER VESSEL INSIDE AN OUTER VESSEL OF A CRYOSTAT

BACKGROUND OF THE INVENTION

The subject matter disclosed herein relates generally to suspension systems, such as suspension systems used to support an inner vessel inside an outer vessel of a cryostat.

Magnetic Resonance Imaging (MRI) systems typically include cryostats to cool coils and/or magnets of the MRI systems. The cryostats include an inner vessel filled with helium suspended within an outer vessel that provides a low pressure atmosphere or vacuum around the inner vessel. The inner vessel may be referred to as a helium vessel and the outer vessel as a vacuum vessel.

In order to suspend the helium vessel within the vacuum vessel, some known cryostats include straps that are coupled to the helium vessel and vacuum vessels at various locations around the perimeter of the helium vessel. The straps are coupled with the helium vessel and the vacuum vessel such that the helium vessel is suspended within the vacuum vessel. For example, the helium vessel may be suspended by tensioning the straps such that the helium vessel is approximately equidistant from the interior surface of the vacuum vessel and able to account for thermal contraction due to temperature differences between the helium vessel and vacuum vessel.

Some known cryostats use clevis fasteners to secure the straps to the helium vessels and the outer vessels. In some known cryostats, the clevis fasteners are multiple pieces such as having a clevis, a stud, a spool, pins, and nuts. The clevis is an approximately U-shaped body having holes on the ends of the U-shape that receive the spool. The pins are inserted through the spool to prevent the spool from being removed from the clevis. The stud is coupled with the clevis and is inserted into a through hole in a block coupled with the vessel. The stud may have a threaded end that receives the nuts to prevent the stud and clevis from being removed from the block. The strap is looped around the spool of one clevis connected to the inner vessel and around the spool of a clevis connected to the outer vessel to interconnect the vessels.

These known clevis fasteners include several components to secure the clevis fasteners to the straps and to each other. Several clevis fasteners may be required to suspend a helium vessel inside the vacuum vessel. As a result, a significant number of components may be required to suspend the helium vessel within the vacuum vessel. The relatively large number of components may increase the cost and/or maintenance requirements of the cryostats.

BRIEF DESCRIPTION OF THE INVENTION

In one embodiment, a suspension system for a cryostat is provided. The system includes a coupling mechanism, a fixation body, and a pin. The coupling mechanism is configured to be joined to one of outer vessel or an inner vessel of the cryostat and coupled with an elongated strap. The fixation body is configured to be joined to the other of the inner vessel or the outer vessel. The fixation body extends between a front side that faces the coupling mechanism and an opposite receiving side with an interior channel extending from the receiving side to the front side. The channel defines a front opening in the front side and a rear opening in the receiving side. The pin is shaped to be loaded into the fixation body through the rear opening in the receiving side of the fixation body with the strap looped around the pin and extending through the front opening of the fixation body to the coupling mechanism. The pin secures the coupling mechanism to the fixation body via the strap by engaging the fixation body inside the channel.

In another embodiment, another suspension system for a cryostat is provided. The system includes a coupling mechanism, a fixation body, and a pin. The coupling mechanism is configured to be joined to one of outer vessel or an inner vessel of the cryostat and coupled with an elongated strap. The fixation body is configured to be joined to the other of the inner vessel or the outer vessel. The fixation body extends between a front side and an opposite receiving side with an interior channel extending from the receiving side to the front side. The channel defines a front opening in the front side and a rear opening in the receiving side. The fixation body includes a ledge in the channel. The pin is shaped to be loaded into the fixation body through the rear opening in the receiving side of the fixation body with the strap looped around the pin and extending through the front opening of the fixation body to the coupling mechanism. The pin secures the coupling mechanism to the fixation body via the strap by engaging the ledge inside the channel of the fixation body.

In another embodiment, a method for securing an inner vessel to an outer vessel in a cryostat is provided. The method includes joining a coupling mechanism to at least one of the inner vessel or the outer vessel and coupling a fixation body to the other of the inner vessel or the outer vessel. The fixation body extends between a front side that faces the coupling mechanism and an opposite receiving side with an interior channel extending from the receiving side to the front side. The channel defines a front opening in the front side and a rear opening in the receiving side. The method also includes inserting a strap through the channel of the fixation body such that the strap extends from the rear side of the fixation body through the rear opening and engaging the strap to a pin outside of the coupling mechanism. The method further includes loading the pin into the fixation body through the rear opening and coupling the strap to the coupling mechanism. The pin prevents the strap from being removed from the fixation body through the front opening by engaging the fixation body inside the channel.

DETAILED DESCRIPTION OF THE INVENTION

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

One or more embodiments described herein provide a suspension system for coupling an inner vessel to an outer vessel in an apparatus, such as in a magnetic resonance imaging (MRI) apparatus. In one embodiment, the suspension system includes a coupling mechanism, such as a clevis, that is joined to one vessel and a fixation body that is coupled to the other vessel. A strap is joined with the clevis and is pulled through a channel in the fixation body to form a loop on a side of the fixation body that faces away from the coupling mechanism. A pin is placed in the loop of the strap and the strap is pulled back through the fixation body toward the coupling mechanism. The pulling of the strap through the fixation body causes the pin to be pulled into the channel of the fixation body. The pin engages the fixation body inside the channel with the strap extending through the channel to the coupling mechanism. The engagement between the pin and the fixation body prevents the pin and the strap from being pulled through and out of the fixation body through the channel. The strap couples the coupling mechanism to the fixation body and the vessels to each other.

Figure 1:
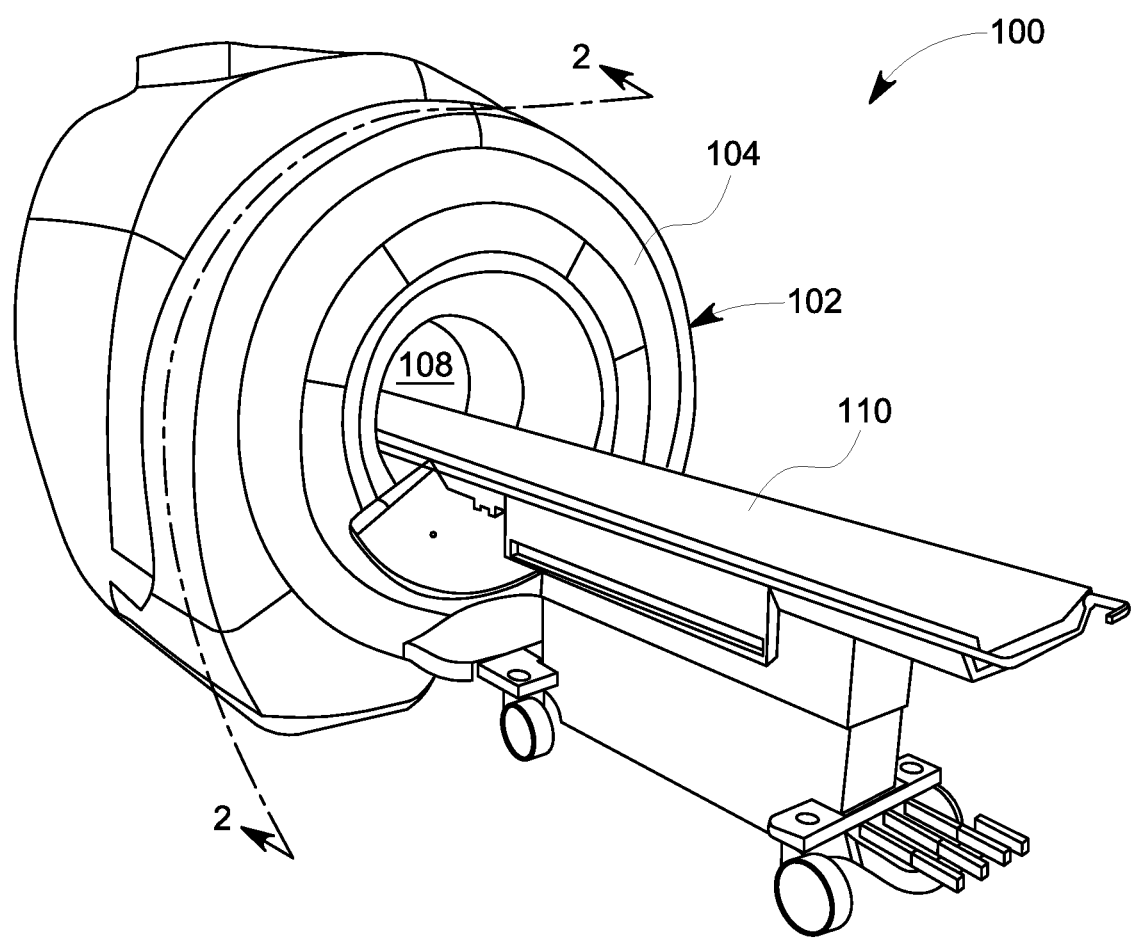
FIG. 1 is a perspective view of one embodiment of a medical imaging system.

Various embodiments of the suspension systems and methods described herein may be provided as part of, or used with, a medical imaging system, such as an imaging system 100 shown in FIG. 1. It should be appreciated that although the imaging system 100 is illustrated as a single modality imaging system, the various embodiments may be implemented in or with multi-modality imaging systems. For example, the imaging system 100 is illustrated as an MRI apparatus and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

In the illustrated embodiment, the imaging system 100 includes an MRI apparatus 102. The apparatus 102 includes a housing 104 that holds a superconducting magnet and one or more gradient and transmit coils, such as a main gradient coil, a shield gradient coil, and a Radio Frequency (RF) coil. A body of an object, such as a patient (not shown), or a phantom to be imaged, is placed in a bore 108 of the apparatus 102 on a suitable support 110, for example, a motorized table (not shown) or other patient table. The magnet inside the housing 104 produces a uniform and static main electromagnetic field across the bore 108. The strength of the electromagnetic field in the bore 108 and correspondingly in the patient, is controlled by a computer controller, which also controls a supply of energizing current to the magnet in the housing 104. The main gradient coil inside the housing 104 imposes a magnetic gradient on the electromagnetic field in the bore 108 in any one or more of three orthogonal directions x, y, and z. The RF transmit coil (which may include a plurality of coils such as resonant surface coils), is arranged to transmit magnetic pulses and/or optionally simultaneously detect Magnetic Resonance (MR) signals from the patient, if receive coil elements are also provided. An RF transmitter generates RF field pulses or signals that are selectively applied to the patient for excitation of magnetic resonance in the patient. Following application of the RF pulses, the detected MR signals are in turn communicated to the computer controller and used to produce signals representative of an image of the patient.

Figure 2:
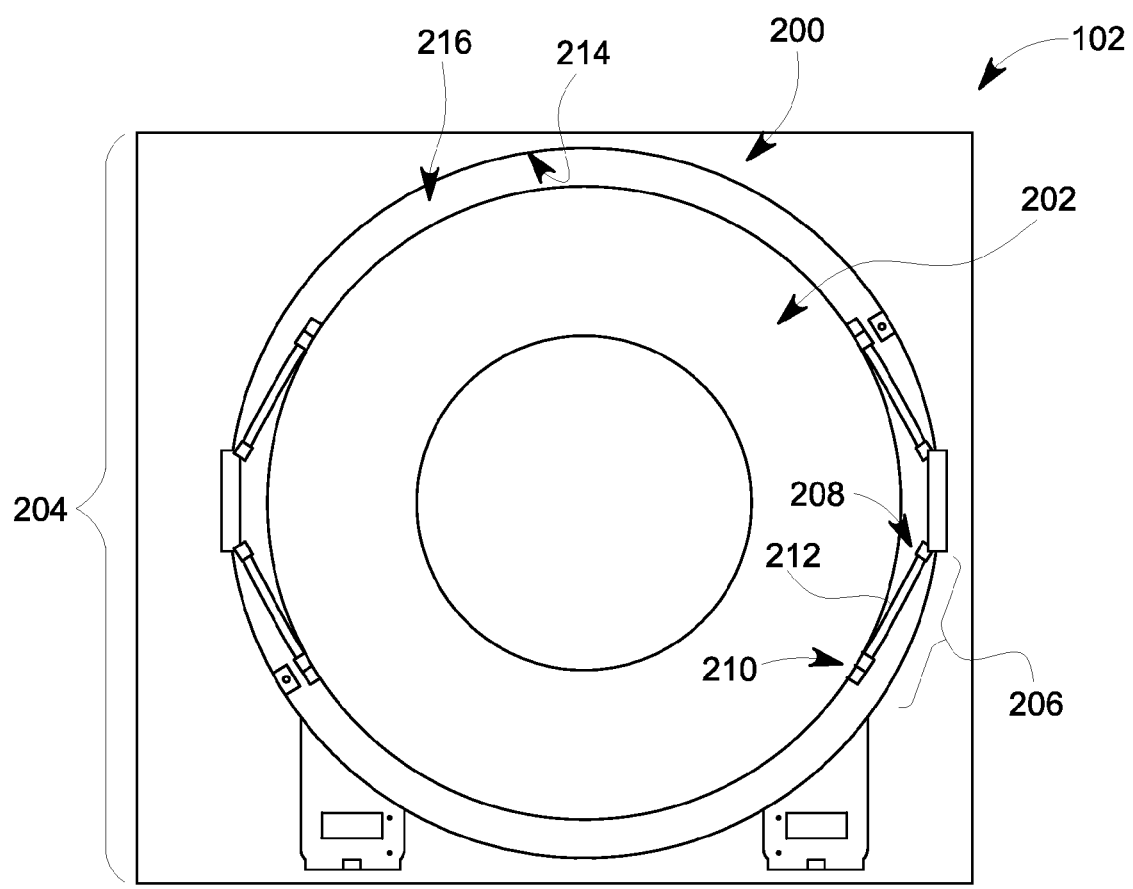
FIG. 2 is a cross-sectional view of an MRI apparatus shown in FIG. 1 along line 2-2 in FIG. 1.

FIG. 2 is a cross-sectional view of the MRI apparatus 102 along line 2-2 in FIG. 1. The housing 104 (shown in FIG. 1) of the MRI apparatus 102 is not shown in FIG. 2. A plurality of vessels is disposed inside the housing 104. The vessels include an outer vessel 200 and an inner vessel 202. The outer and inner vessels 200, 202 form a cryostat 204. The outer vessel 200 preserves a low pressure atmosphere, such as a vacuum, around the inner vessel 202 and may be referred to as a vacuum vessel. The inner vessel 202 is disposed within the outer vessel 200. The magnet used to image a patient may be a superconducting magnet located within or near the inner vessel 202. The inner vessel 202 holds a coolant, such as liquid helium. The inner vessel 202 may be referred to as a helium vessel, although not all embodiments described herein are limited to an inner vessel 202 being filled with helium. The outer vessel 200 and the inner vessel 202 together form a cryostat subassembly 204. In operation, the inner vessel 200 is filled with liquid helium to cool the coils of the superconducting magnet in the MRI apparatus 102. A thermal insulation (not shown) may be provided in a space between the inner vessel 202 and the outer vessel 200.

As shown in FIG. 2, the inner vessel 202 is disposed within the volume defined or encompassed by the outer vessel 200 without directly contacting or abutting the outer vessel 200. Several suspension systems 206 are coupled with the inner vessel 202 and the outer vessel 200 to suspend the inner vessel 202 within the outer vessel 200. While only four suspension systems 206 are shown in FIG. 2, a different number may be provided. For example, eight or more suspension systems 206 may be used. Alternatively, fewer than four suspension systems 206 may be used and/or other suspension systems may be used.

The suspension systems 206 include coupling mechanisms 208 joined with fixation bodies 210 by straps 212. In the illustrated embodiment, the coupling mechanisms 208 are joined to an interior surface 214 of the outer vessel 200 and the fixation bodies 210 are joined to an exterior surface 216 of the inner vessel 202. Alternatively, one or more of the coupling mechanisms 208 may be joined to the inner vessel 202 and/or one or more of the fixation bodies 210 may be joined to the outer vessel 200. The straps 212 secure the coupling mechanisms 208 to the fixation bodies 210 such that the inner vessel 202 is suspended within the outer vessel 200.

Figure 3:
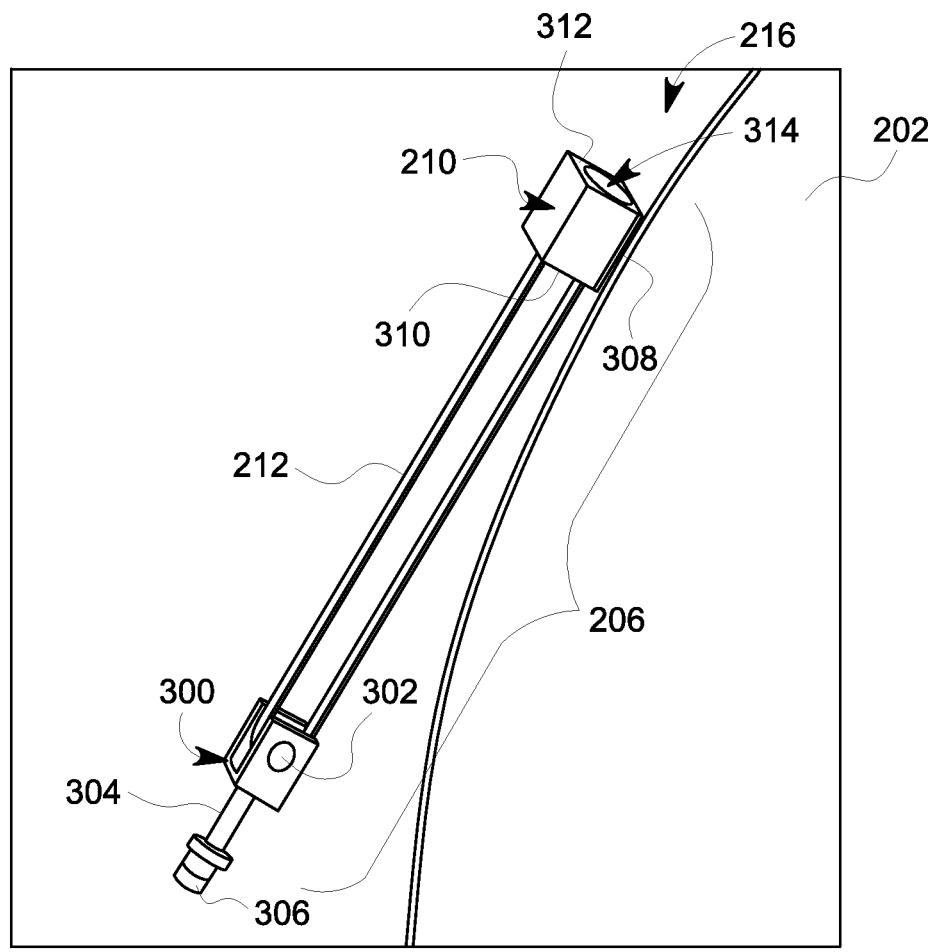
FIG. 3 is a perspective view of one embodiment of a suspension system shown in FIG. 2.

FIG. 3 is a perspective view of one embodiment of the suspension system 206. As shown in FIG. 3, the coupling mechanism 208 may be a clevis fastener, such as an assembly having a clevis body 300 that receives a clevis pin 302. The strap 212 is looped or wrapped around the clevis pin 302 and the clevis pin 302 is held by the clevis body 300. For example, the strap 212 may be formed in a loop (such as an oblong "O" shape) with the clevis pin 302 extending through the center of the loop. Although not shown in FIG. 3, the clevis body 300 may be secured to the outer vessel 200 by inserting an elongated extension 304 of the clevis body 300 into a receptacle (not shown) of the outer vessel 200 and engaging fasteners 306 (such as bolts) onto the end of the elongated extension 304 to prevent removal of the clevis body 300 from the outer vessel 200 and to support the inner vessel 202.

The strap 212 is received into the fixation body 210 to secure the fixation body 210 to the coupling mechanism 208. The fixation body 210 has a mounting side 308 that is secured to the exterior surface 216 of the inner vessel 202. The mounting side 308 may be secured to the exterior surface 216 using one or more fasteners, such as bolts or screws, adhesives, and/or welding. The fixation body 210 extends between a front side 310 and an opposite receiving side 312. As shown in FIG. 3, the front side 310 may face the coupling mechanism 208 while the receiving side 312 faces away from the coupling mechanism 208. The mounting side 308 intersects the front and receiving sides 310, 312 in the illustrated embodiment.

A channel 314 extends through the fixation body 210 from the front side 310 to the receiving side 312. As described below, the strap 212 is held in place relative to the fixation body 210 within the channel 314. As shown in FIG. 3, the strap 212 at least partially extends from the coupling mechanism 208 and into the channel 314 of the fixation body 210, where the strap 212 is secured to the fixation body 210. In one embodiment, the strap 212 may be free to rotate relative to the fixation body 210 and the coupling mechanism 208 while the strap 212 secures the fixation body 210 and the coupling mechanism 208 to each other.

Figure 4:
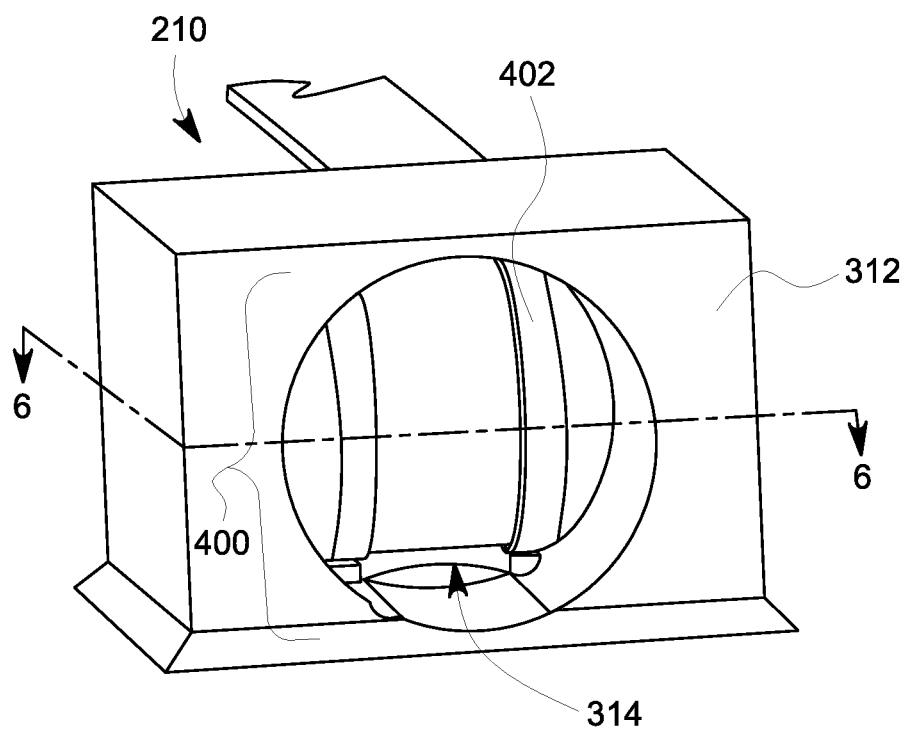
FIG. 4 is a perspective view of a fixation body shown in FIG. 2.
Figure 5:
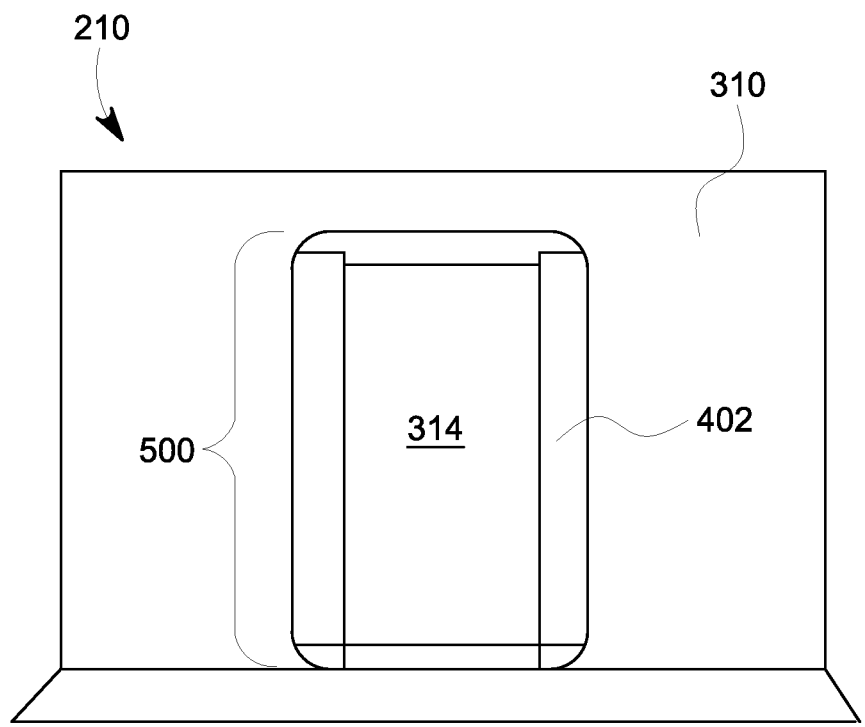
FIG. 5 is a plan view of the fixation body shown in FIG. 2.

FIG. 4 is a perspective view of the fixation body 210 that illustrates the receiving side 312 of the fixation body 210. FIG. 5 is a plan view of the fixation body 210 that illustrates the front side 310 of the fixation body 210. The channel 314 of the fixation body 210 extends all the way through the fixation body 210 in the illustrated embodiment. The channel 314 defines a rear opening 400 (shown in FIG. 4) in the receiving side 312 and a front opening 500 (shown in FIG. 5) in the front side 310. For example, the receiving side 312 extends around or encircles the entire outer perimeter or periphery of the rear opening 400 and the front side 310 extends around or encircles the entire outer perimeter or periphery of the front opening 500. Alternatively, one or more of the receiving side 312 and/or front side 310 may extend around less than the entire perimeter or periphery of the corresponding rear and/or front openings 400, 500.

As shown in FIGS. 4 and 5, the rear and front openings 400, 500 have different shapes. For example, the rear opening 400 may have an approximately circular shape while the front opening 500 has a rectangular shape. Alternatively, the rear and/or front opening 400, 500 may have another shape. In another embodiment, the rear and front openings 400, 500 may have the same or similar shapes but different sizes. For example, the surface area of the rear side 312 that is removed in order to create the rear openings 400 may be smaller than the surface area of the front side 310 that is removed in order to create the front opening 500.

A retention pin 402 (shown in FIG. 4) is positioned inside the channel 314. As described below, the strap 212 is wrapped around the pin 402 and the pin 402 is loaded into the channel 314 through the rear opening 400 (shown in FIG. 4). The pin 402 is shaped to be received through the rear opening 400. The pin 402 also may be shaped such that the pin 402 cannot be removed through the front opening 500 (shown in FIG. 5) in the front side 310. For example, the pin 402 may be shaped (such as by being elongated in one direction) so that the pin 402 can fit through the rear opening 400 but cannot fit through the front opening 500. In one embodiment, the pin 402 may engage the fixation body 210 inside the channel 314 to prevent removal of the pin 402 through the front opening 500.

Figure 6:
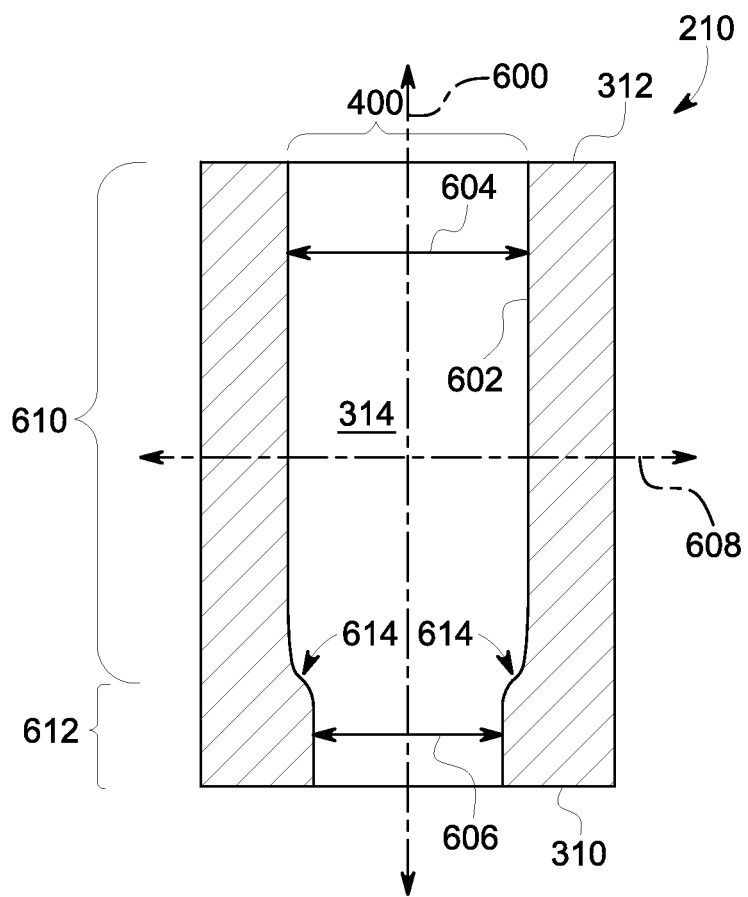
FIG. 6 is a cross-sectional view of the fixation body along line 6-6 shown in FIG. 4.

FIG. 6 is a cross-sectional view of the fixation body 210 along line 6-6 shown in FIG. 4. As described above, the channel 314 is elongated along a center axis 600 of the fixation body 210 from the receiving side 312 to the front side 310. The channel 314 is bounded inside the fixation body 210 by an interior surface 602 of the fixation body 210. Lateral dimensions 604, 606 of the channel 314 represent the size of the channel 314 along, or parallel to, a lateral axis 608 of the fixation body 210. As shown in FIG. 6, the lateral dimensions 604, 606 of the channel 314 may be stepped in size to define different sections of the channel 314. For example, the channel 314 includes a receiving section 610 and a blocking section 612, with the channel 314 having a larger lateral dimension 604 in the receiving section 610 and a smaller lateral dimension 606 in the blocking section 612. Alternatively, the channel 314 may include a different number of sections and/or have different relative lateral dimensions of the sections.

The interior surface 602 of the fixation body 210 defines one or more ledges 614 at the interface between the receiving and blocking sections 610, 612. The ledges 614 represent shoulders or other surfaces inside the channel 314 that the pin 402 (shown in FIG. 4) engages when the pin 402 is loaded into the channel 314 through the rear opening 400 of the fixation body 210. In one embodiment, the ledges 614 may be formed by creating grooves into the interior surface 602 of the fixation body 210 throughout the receiving section 610 and thereby creating the larger receiving section 610. For example, prior to forming the receiving section 610, the channel 314 may have a width that is equivalent to the lateral dimension 606 throughout the fixation body 210. Grooves may be cut into the fixation body 210 from the receiving side 312 toward the front side 310 to create recesses in the interior surface 602 of the fixation body 210 on opposite sides of the channel 314. The recesses form the receiving section 610 and widen the channel 314 inside the receiving section 610 to the larger lateral dimension 604. Alternatively, the grooves may be molded into the fixation body 210 to form the receiving section 610.

Figure 7:
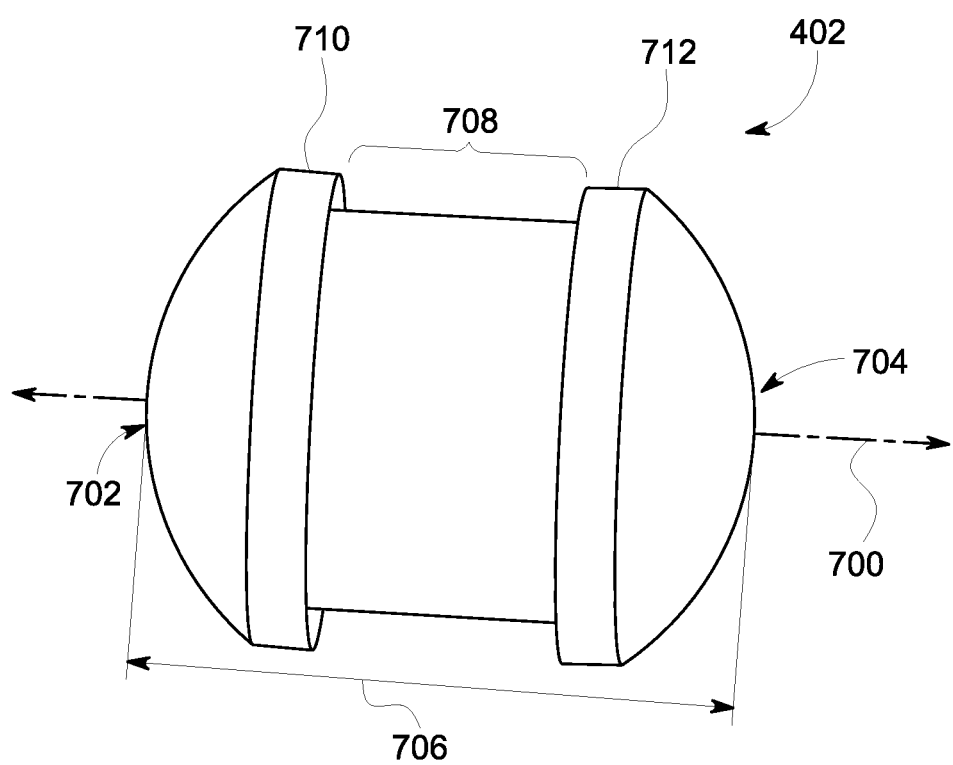
FIG. 7 is a perspective view of one embodiment of a retention pin shown in FIG. 4.

FIG. 7 is a perspective view of one embodiment of the retention pin 402. The pin 402 is elongated along a longitudinal axis 700 between opposite ends 702, 704. In the illustrated embodiment, the ends 702, 704 are rounded ends. For example, the ends 702, 704 may have a spherical shape such that the ends 702, 704 are shaped as portions of a sphere. Alternatively, one or more of the ends 702, 704 may be flattened or have a more sharpened point. The pin 402 has a length dimension 706 that is measured along, or parallel to, the longitudinal axis 700 from one end 702 to the other end 704. In one embodiment, the pin 402 is sized to be received in the channel 314 (shown in FIG. 3) of the fixation body 210 (shown in FIG. 2) through the rear opening 400 (shown in FIG. 4) of the receiving side 312 (shown in FIG. 3) of the fixation body 210, but too large to be removed from the channel 314 through the front opening 500 (shown in FIG. 5) in the front side 310 (shown in FIG. 3) of the fixation body 210.

With reference to the cross-sectional view of the fixation body 210 shown in FIG. 6, the length dimension 706 of the pin 402 may be larger than the lateral dimension 606 of the blocking section 612 of the fixation body 210, but no larger than the lateral dimension 604 of the receiving section 610 of the fixation body 210. For example, the length dimension 706 of the pin 402 may be between the lateral dimensions 604, 606 of the channel 314, with the larger lateral dimension 604 representing an upper limit on the length dimension 706 and the smaller lateral dimension 606 representing a lower limit on the length dimension 706.

The pin 402 includes a recessed area 708 disposed between the opposite ends 702, 704. The recessed area 708 laterally extends along the longitudinal axis 700 between opposing flanges 710, 712. The recessed area 708 may be shaped to receive the strap 212 (shown in FIG. 2). For example, the strap 212 may fit within the recessed area 708 between the flanges 710, 712 when the strap 212 is at least partially wrapped around the pin 402, such as by partially wrapping the strap 212 around the longitudinal axis 700 within the recessed area 708.

Figure 13:
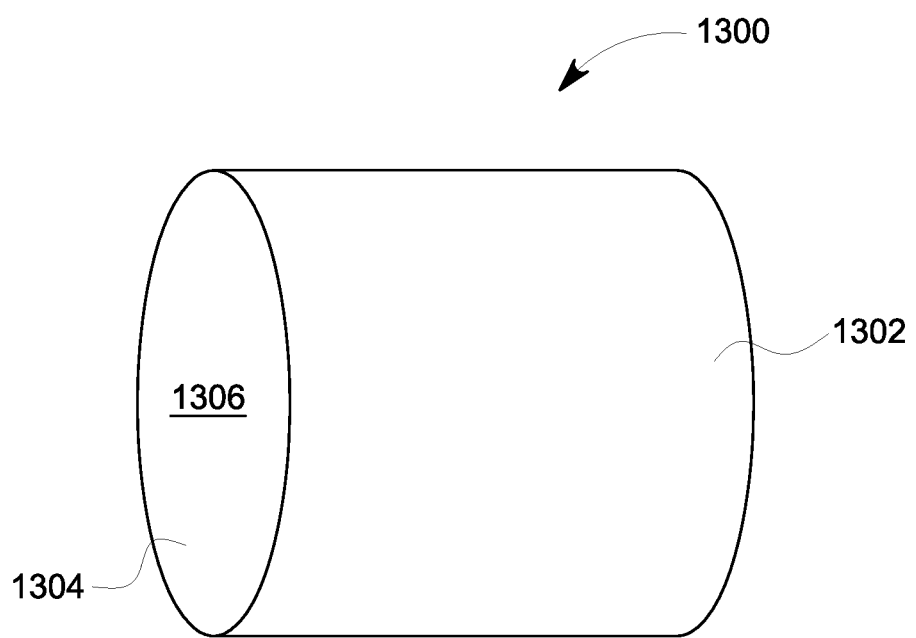
FIG. 13 is a perspective view of a collar that is disposed around at least a portion of the pin shown in FIG. 4 in one embodiment.

FIG. 13 illustrates a perspective view of a collar 1300 that may be coupled with the pin 402 in one embodiment. The recessed area 708 of the pin 402, may have the collar 1300 installed. The collar 1300 is a tubular body having an outer surface 1302, an opposite inner surface 1304, and a channel 1306 disposed within the body. The collar 1300 is separate from the pin 402 in that the collar 1300 may be separately formed from the pin 402. The collar 1300 may be positioned around the recessed area 708 of the pin 402. For example, the recessed area 708 of the pin 402 may be positioned within the channel 1306. In one embodiment, the collar 1300 may be formed and installed such that the collar 1300 is free to rotate around the pin 402 within the recessed area 708 and provides an intermediate surface contact for the strap 212 to engage. Alternatively, the collar 1300 may be secured to the pin 402 (e.g., using an adhesive, interference fit, welding, or other fixation device) and not capable of rotating relative to the pin 402. The internal diameter of the loop formed by the strap 212 can rest on the outer surface 1302 of the collar 1300 and the collar 1300 may rotate around the pin 402. In one embodiment, the collar 1300 and the pin 402 are formed from different materials.

Figure 8:
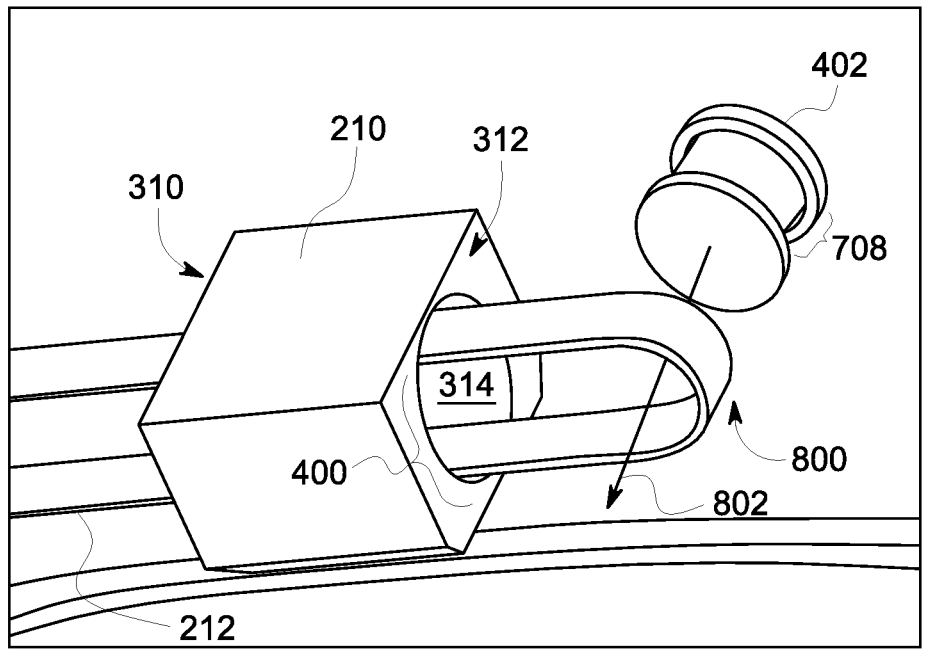
FIG. 8 is a perspective view of one embodiment of the fixation body and the retention pin shown in FIG. 4.
Figure 9:
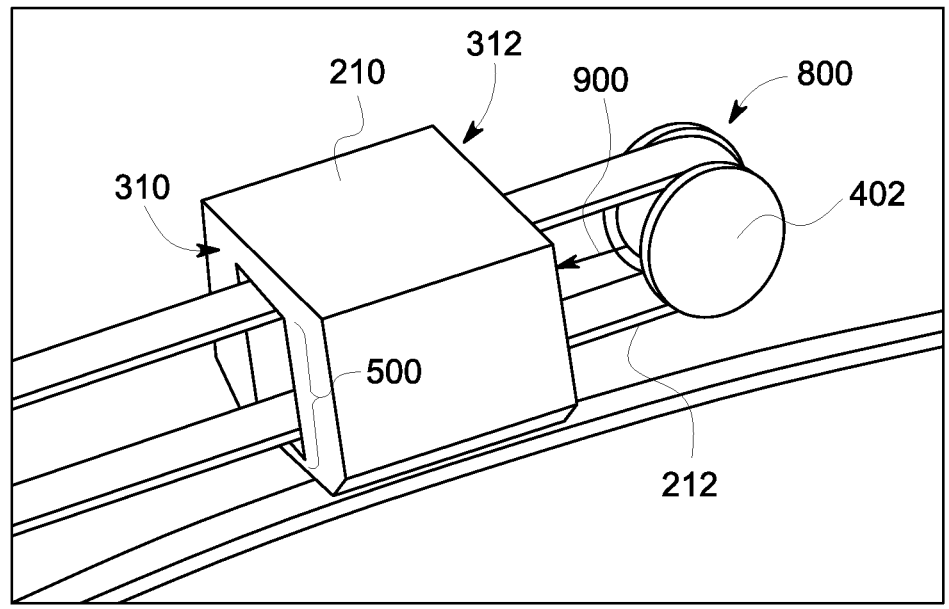
FIG. 9 is another perspective view of one embodiment of the fixation body and the retention pin shown in FIG. 4.

FIGS. 8 and 9 show how the pin 402 may be used to secure the strap 212 with respect to the fixation body 210 in accordance with one embodiment. With respect to FIG. 8, the strap 212 can be fed through the channel 314 of the fixation body 210 from the front side 310 toward the receiving side 312 of the fixation body 210. For example, the strap 212 may be formed into a loop having a looped end 800 (such as by forming a "U" shape with the strap 212, as shown in FIGS. 8 and 9) and inserted into the channel 314 through the front opening 500 in the front side 310 of the fixation body 210. The strap 212 is loaded through the channel 314 until the looped end 800 of the strap 212 passes through the rear opening 400 and projects out of the receiving side 312 of the fixation body 210, as shown in FIG. 8.

The pin 402 can then be placed inside the looped end 800 of the strap 212. For example, the pin 402 may be moved in a direction shown by an arrow 802 in FIG. 8 until the strap 212 is received in the recessed area 708 of the pin 402, as shown in FIG. 9. The strap 212 engages the pin 402 within the recessed area 708 of the pin 402 such that the strap 212 may then be pulled back toward the fixation body 210 in the direction illustrated by an arrow 900 in FIG. 9.

The strap 212 is pulled along the direction of the arrow 900 and the pin 402 is received into the channel 314 through the rear opening 400. The strap 212 may continue to be pulled along the direction of the arrow 900 from a location between the coupling mechanism 208 (shown in FIG. 2) and the front side 310 of the fixation body 210. As the strap 212 is pulled in this direction, the pin 402 moves within the channel 314 until the pin 402 engages the ledges 614 (shown in FIG. 6) of the fixation body 210.

Figure 10:
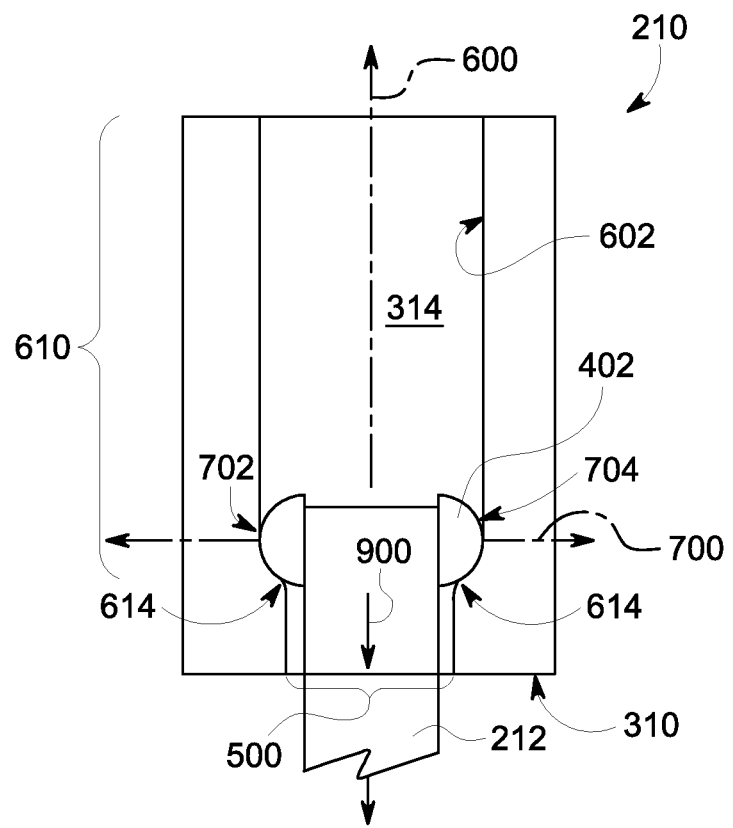
FIG. 10 is another cross-sectional view of the fixation body along line 6-6 shown in FIG. 6 in accordance with one embodiment.
Figure 11:
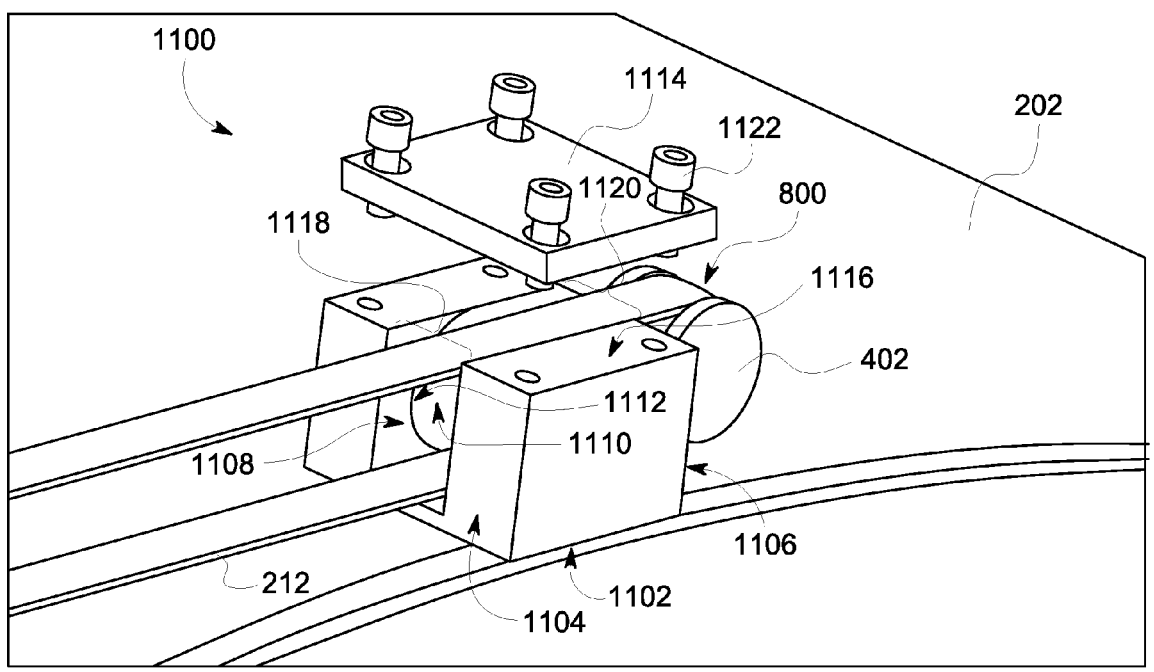
FIG. 11 is an exploded view of a fixation body in accordance with another embodiment.

FIG. 10 is another cross-sectional view of the fixation body 210 along line 6-6 shown in FIG. 6 with the pin 402 disposed inside the fixation body 210 in accordance with one embodiment. The pin 402 moves along the center axis 600 of the fixation body 210 as the strap 212 is pulled in the direction of the arrow 900 until the pin 402 engages the ledges 614. The ledges 614 abut the pin 402 and prevent the pin 402 from moving further in the channel 314 in the direction of the arrow 900. For example, as the pin 402 is wider than the channel 314 at the ledges 614, the ledges 614 abut the pin 402 and prevent the pin 402 from being removed from the channel 314 through the front opening 500 in the front side 310 of the fixation body 210. As shown in FIG. 11, the pin 402 and the strap 212 are elongated in perpendicular or approximately perpendicular directions when the pin 402 engages the ledges 614.

The strap 212 is wrapped around the pin 402 (or is otherwise coupled to the pin 402) such that the engagement between the pin 402 and the ledges 614 prevents the strap 212 from being removed from the fixation body 210. As a result, the strap 212 is coupled to the fixation body 210. The strap 212 can be joined to the coupling mechanism 208 (shown in FIG. 2) in order to couple the fixation body 210 to the coupling mechanism 208. After mounting the coupling mechanism 208 and the fixation body 210 to the vessels 200, 202 (shown in FIG. 2), the strap 212 may be used to suspend the inner vessel 202 within the outer vessel 200.

The strap 212 may provide a tensile force between the coupling mechanism 208 and the fixation body 210. For example, the strap 212 may be sufficiently short that the strap 212 is in a state of positive tension, such as by being pulled toward each of the coupling mechanism 208 and the fixation body 210. The tension on the strap 212 may be used to suspend the inner vessel 202 (shown in FIG. 2) within the outer vessel 200 (shown in FIG. 2) when several suspension systems 206 (shown in FIG. 2) are used to couple the inner vessel 202 to the outer vessel 200.

In one embodiment, the pin 402 may be able to rotate within the channel 314 of the fixation body 210. For example, after the strap 212 is pulled to cause the pin 402 to abut the ledges 614, rotation of the loop formed by the strap 212 may cause the pin 402 to rotate about the longitudinal axis 700 of the pin 402 within the channel 314. The interior surface 602 of the fixation body 210 within the receiving section 610 may be formed as concave grooves having shapes that are complementary or approximately complementary to the convex rounded ends 702, 704 of the pin 402. For example, the interior surface 602 may have a concave spherical shape at or near the ledges 614 and the ends 702, 704 may have convex spherical shapes. The convex spherical shapes of the ends 702, 704 may fit within the concave spherical interior surface 602 and allow the ends 702, 704 to rotate within the channel 314 relative to the fixation body 210. The strap 212 may be rotated (and thus cause the pin 402 to rotate within and relative to the fixation body 210) if the strap 212 is tightened or otherwise adjusted relative to the coupling mechanism 208 (shown in FIG. 2) or the fixation body 210.

The fixation body 210 may be formed as a unitary body. For example, the fixation body 210 may be molded or cast as a single, continuous body and not created from discrete or separate parts that are coupled to each other, such as by welding, fasteners, and the like. Providing the fixation body 210 as a unitary body may create a stronger fixation body 210 as the unitary body may not have weakened joints or interfaces between discrete parts that are coupled to each other.

FIG. 11 is an exploded view of a fixation body 1100 in accordance with another embodiment. The fixation body 1100 may be included in the suspension system 206 (shown in FIG. 2). For example, the fixation body 1100 may be coupled to one end of the looped strap 212 with the coupling mechanism 208 (shown in FIG. 2) coupled to an opposite end of the looped strap 212. The fixation body 1100 can be affixed to the inner vessel 202 or the outer vessel 200 (shown in FIG. 2), similar to the fixation body 210 (shown in FIG. 2) to suspend the inner vessel 202 within the outer vessel 200.

The fixation body 1100 is similar to the fixation body 210 (shown in FIG. 2) in the illustrated embodiment. For example, the fixation body 1100 includes a mounting side 1102 that is coupled to the inner vessel 202 and that intersects a front side 1104 and an opposite receiving side 1106. A channel 1108 extends through the fixation body 1100 from the receiving side 1106 to the front side 1104. The channel 1108 defines a front opening 1118 and a rear opening 1120 in the front and receiving sides 1104, 1106, respectively. The fixation body 1100 includes grooves 1110 inside the channel 1108. The grooves 1110 may form a receiving section and a blocking section in the fixation body 1100, similar to the receiving section 610 (shown in FIG. 6) and the blocking section 612 (shown in FIG. 6) of the fixation body 210. As shown in FIG. 11, the grooves 1110 extend from the receiving side 1106 toward the front side 1104. The grooves 1110 extend to and terminate at ledges 1112 disposed inside the channel 1108. The ledges 1112 may be similar to the ledges 614 (shown in FIG. 6) of the fixation body 210.

One difference between the fixation body 1100 and the fixation body 210 (shown in FIG. 2) is that the fixation body 1100 is a non-unitary body, or a body formed by coupling two or more parts, sections, or components to each other. In the illustrated embodiment, the fixation body 1100 includes a lid plate 1114 that is disposed opposite of the mounting side 1102. The lid plate 1114 is coupled to a top side 1116 of the fixation body 1100. The top side 1116 extends between the opposite front and receiving sides 1104, 1106 and is oriented parallel to the mounting side 1102 in the illustrated embodiment. As shown in FIG. 11, the front and receiving sides 1104, 1106 have approximate "U" shapes such that the front and receiving sides 1104, 1106 do not entirely encircle or extend around the peripheries of the openings 1118, 1120 of the front and receiving sides 1104, 1106. For example, the openings 1118, 1120 are open at intersections between the top side 1116 and each of the front and receiving sides 1104, 1106 when the lid plate 1114 is removed from the top side 1116.

The lid plate 1114 is coupled to the top side 1116 of the fixation body 1100 to enclose the channel 1108. The lid plate 1114 also closes off the open ends of the openings 1118, 1120 at the intersections of the top side 1116 with each of the front and receiving sides 1104, 1106. For example, once the lid plate 1114 is coupled to the top side 1116, the front opening 1118 is encircled by the front side 1104 and the lid plate 1114 and the rear opening 1120 is encircled by the receiving side 1106 and the lid plate 1114. The lid plate 1114 may be secured to the top side 1116 using one or more fasteners 1122, such as screws, bolts, adhesives, welding, or other components.

In operation, the lid plate 1114 is decoupled from the top side 1116. The strap 212 is formed into a loop and the pin 402 is placed into the looped end 800 of the strap 212. The strap 212 may be lowered into the channel 1108 through the top side 1116. For example, with the lid plate 1114 removed, the channel 1108 is exposed, or open, along the top side 1116. The strap 212 may be lowered into the channel 1108 with the pin 402 disposed outside of the fixation body 1100, such as in the position shown in FIG. 11. The lid plate 1114 can then be coupled to the top side 1116 of the fixation body 1100 to enclose the strap 212 within the channel 1108. The strap 212 may then be pulled away from the fixation body 1100 and toward the coupling mechanism 208 (shown in FIG. 2), as described above. As the strap 212 is pulled, the pin 402 is pulled into the channel 1108 until the pin 402 engages the ledges 1112, similar to as described above in connection with the fixation body 210 (shown in FIG. 2). The pin 402 engages the ledges 1112 and prevents the pin 402 from being pulled out of the channel 1108 through the front opening 1118 of the fixation body 1100. The pin 402 also prevents the strap 212 from being pulled out of the channel 1108 through the front opening 1118.

In another embodiment, the fixation body 1100 is not coupled with the lid plate 1114. For example, the lid plate 1114 may not be fixed to the top side 1116 and the channel 1108 may be open through the top side 1116 of the fixation body 1100. The pin 402 can be prevented from being removed through the top side 1116 by the force that is applied to the pin 402 by the strap 212. For example, the strap 212 may pull on the pin 402 with sufficient force to keep the pin 402 within the channel 1108 and pressed against the ledges 1112 within the channel 1108.

Figure 12:
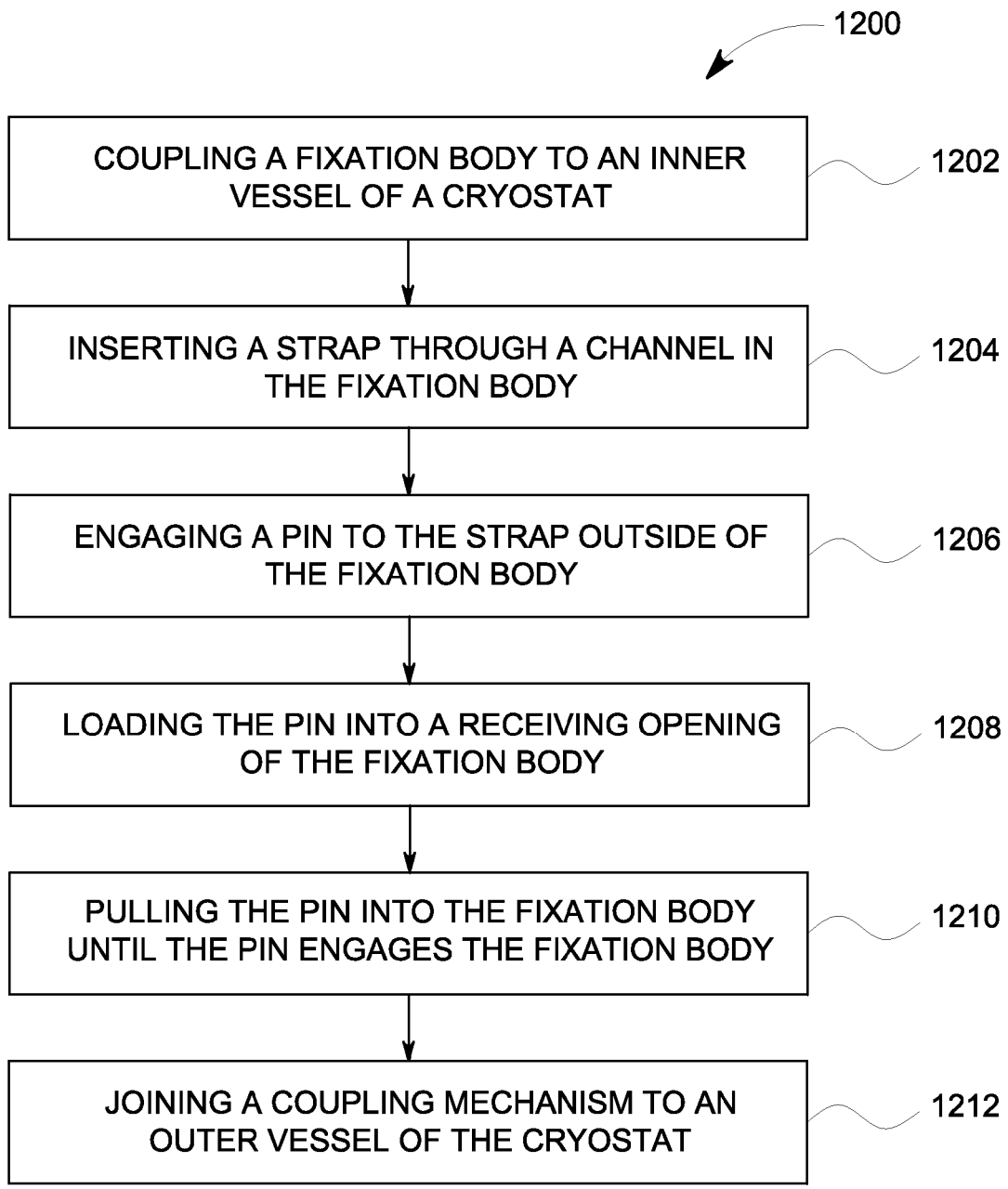
FIG. 12 is one embodiment of a flowchart for a method for securing an inner vessel to an outer vessel in a cryostat.

FIG. 12 is one embodiment of a flowchart for a method 1200 for securing an inner vessel to an outer vessel in a cryostat. The method 1200 may be used to suspend the inner vessel 202 (shown in FIG. 2) inside the outer vessel 200 (shown in FIG. 2) of the cryostat 204 (shown in FIG. 2) disposed within the MRI apparatus 102 (shown in FIG. 1).

At 1202, a fixation body is coupled to an inner vessel of the cryostat. For example, the fixation body 210, 1100 (shown in FIGS. 2 and 11) may be affixed to the exterior surface 216 (shown in FIG. 2) of the inner vessel 202 (shown in FIG. 2). The fixation body may be secured to the inner vessel using one or more fasteners or adhesives or welding, for example. Alternatively, the fixation body is coupled to an outer vessel of the cryostat, such as the outer vessel 200 (shown in FIG. 2).

At 1204, a strap is inserted through a channel in the fixation body. For example, the strap 212 (shown in FIG. 2) may be looped or bent so as to form the looped end 800 (shown in FIG. 8). The looped end of the strap may be inserted into a channel that extends lengthwise through the fixation body, such as into the channel 314, 1108 (shown in FIGS. 3 and 11). The strap is inserted into the channel through a front side of the fixation body until the looped end of the strap protrudes from an opposite receiving side of the fixation body in one embodiment. Alternatively, the fixation body may have a removable component, such as the lid plate 1114 (shown in FIG. 11) that is removed to expose the channel in the fixation body. The strap may then be inserted into the channel through the top side of the fixation body.

At 1206, a pin is engaged to the strap. In one embodiment, the pin is engaged to the strap by inserting the pin inside the looped end of the strap. Alternatively, the strap may be secured to the pin by affixing the strap to the pin using fasteners or adhesives. The pin may be engaged to the strap outside of the fixation body, such as on the side of the fixation body that is opposite the side that the strap was inserted into the fixation body. Alternatively, the pin may be positioned inside the channel of the fixation body and then the strap is secured to the pin inside the fixation body.

At 1208, the pin is loaded into the channel of the fixation body through a rear opening in the fixation body. The rear opening may be the opening from which the looped end of the strap protrudes when the strap is placed into the channel. The pin may be loaded into the channel by pulling on the pin outside of the fixation body, such as by pulling the strap away from the fixation body from a section of the strap located away from the looped end of the strap.

At 1210, the pin is pulled into the fixation body until the pin engages one or more ledges inside the channel of the fixation body. For example, the strap may continue to be pulled away from the fixation body such that the pin is pulled further into the channel. The fixation body may have ledges that extend into the channel or grooves cut into interior surfaces of the fixation body inside the channel. The pin engages or abuts the ledges when the pin is pulled sufficiently far into the channel by the strap. The engagement between the pin and the ledges prevents the strap from being pulled further. For example, the ledges block the pin from moving further in the channel and secure the strap to the fixation body.

At 1212, a coupling mechanism is joined to an outer vessel of the cryostat and the strap is joined to the coupling mechanism. Alternatively, if the fixation body is joined to the outer vessel, the coupling mechanism may be joined to the inner vessel. The strap is secured to the coupling mechanism such that the strap interconnects the coupling mechanism with the fixation body. Several straps, coupling mechanisms, and fixation bodies may be used to couple the inner and outer vessels with each other such that the inner vessel is suspended within the outer vessel. In one embodiment, the coupling mechanism is a clevis. In another embodiment, a different coupling mechanism other than a clevis may be used. For example, a fixation body and pin may be used for the coupling mechanism.

One or more embodiments described herein provide systems and methods for suspending an inner vessel inside an outer vessel, such as a helium vessel suspended inside a vacuum vessel of a cryostat. The systems may use fixation blocks that reduce the number of components used to interconnect the inner and outer vessels. Reducing the number of components used to interconnect the vessels can decrease the cost and/or maintenance of the cryostat and/or MRI apparatuses that include the cryostats.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to one of ordinary skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A suspension system for a cryostat, the system comprising:
   a coupling mechanism configured to be joined to one of an outer vessel or an inner vessel of the cryostat and coupled with an elongated strap;
   a fixation body configured to be joined to the other of the outer vessel or the inner vessel, the fixation body extending between a front side that faces the coupling mechanism and an opposite receiving side with an interior channel extending from the receiving side to the front side, the channel defining a front opening in the front side and a rear opening in the receiving side; and
   a pin shaped to be loaded into the fixation body through the rear opening in the receiving side of the fixation body with the strap looped around the pin and extending through the front opening of the fixation body to the coupling mechanism, wherein the pin secures the coupling mechanism to the fixation body via the strap by engaging the fixation body inside the channel, wherein the rear opening of the fixation body is shaped to receive the pin and the front opening of the fixation body removal of the pin from the fixation body through the front opening while allowing the strap to pass through the front side to the coupling mechanism.

2. The system of claim 1, wherein the fixation body includes a ledge inside the channel, the ledge preventing the pin and the strap from being removed from the fixation body through the front side of the fixation body when the pin engages the ledge.

3. The system of claim 1, wherein the fixation body includes opposing interior grooves disposed on opposite sides of the channel, the grooves extending to ledges that prevent the pin and the strap from being removed from the fixation body through the front side of the fixation body when the pin engages the ledges.

4. The system of claim 1, wherein the pin is elongated along a longitudinal axis between opposite ends, the ends shaped to rotate about the longitudinal axis within the fixation body.

5. The system of claim 1, wherein at least one of the front side of the fixation body extends around an entire outer perimeter of the front opening or the receiving side of the fixation body extends around an entire outer perimeter of the rear opening.

6. The system of claim 1, wherein the fixation body includes a removable lid plate, the lid plate separable from the fixation body to expose the channel through a top side of the fixation body that extends between the front side and the receiving side.

7. The system of claim 1, further comprising a collar that is separate from the pin and disposed around at least a portion of the pin, wherein the strap engages the collar around the pin.

8. A suspension system for a cryostat, the system comprising:
   a coupling mechanism configured to be joined to one of an outer vessel or an inner vessel of the cryostat and coupled with an elongated strap;
   a fixation body configured to be joined to the other of the outer vessel or the inner vessel, the fixation body extending between a front side and an opposite receiving side with an interior channel extending from the receiving side to the front side, the channel defining a front opening in the front side and a rear opening in the receiving side, the fixation body having a ledge in the channel; and a pin shaped to be loaded into the fixation body through the rear opening in the receiving side of the fixation body with the strap looped around the pin and extending through the front opening of the fixation body to the coupling mechanism, wherein the pin secures the coupling mechanism to the fixation body via the strap by engaging the ledge inside the channel of the fixation body, wherein the pin is elongated along a longitudinal axis between opposite ends, the ends shaped to rotate about the longitudinal axis within the fixation body.

9. The system of claim 8, wherein the fixation body includes opposing interior grooves disposed on opposite sides of the channel, the grooves extending to the ledge that prevent the pin and the strap from being removed from the fixation body through the front side of the fixation body when the pin engages the ledge.

10. The system of claim 8, wherein the rear opening of the fixation body is shaped to receive the pin and the front opening of the fixation body is shaped to prevent removal of the pin from the fixation body through the front opening while allowing the strap to pass through the front side to the coupling mechanism.

11. The system of claim 8, wherein at least one of the front side of the fixation body extends around an entire outer perimeter of the front opening or the receiving side of the fixation body extends around an entire outer perimeter of the rear opening.

12. The system of claim 8, wherein the fixation body is a unitary body.

13. The system of claim 8, wherein the fixation body includes a removable lid plate, the lid plate separable from the fixation body to expose the channel through a top side of the fixation body that extends between the front side and the receiving side.

14. A method for securing an inner vessel to an outer vessel in a cryostat, the method comprising:

joining a coupling mechanism to at least one of the outer vessel or the inner vessel;

coupling a fixation body to the other of the outer vessel or the inner vessel, the fixation body extending between a front side that faces the coupling mechanism and an opposite receiving side with an interior channel extending from the receiving side to the front side, the channel defining a front opening in the front side and a rear opening in the receiving side;

inserting a strap through the channel of the fixation body such that the slap extends from the rear side of the fixation body through the rear opening;

engaging the strap to a pin outside of the coupling mechanism;

loading the pin into the fixation body through the rear opening, the pin preventing the strap from being removed from the fixation body through the front opening by engaging the fixation body inside the channel; and coupling the strap to the coupling mechanism.

15. The method of claim 14, wherein engaging the strap to the pin includes forming a looped end with the strap outside of the fixation body and placing the pin within the looped end.

16. The method of claim 14, wherein loading the pin includes positioning opposite ends of the pin into grooves disposed on opposite sides of the channel in the fixation body.

17. The method of claim 14, wherein loading the pin includes pulling on the strap to pull the pin into the channel of the fixation body through the rear opening.

18. The method of claim 14, wherein coupling the strap to the coupling mechanism includes extending the strap around the pin inside the channel of the fixation body and out of the fixation body through the front opening to the coupling mechanism.

* * * * *